(12) United States Patent
Yi et al.

(10) Patent No.: US 8,227,357 B2
(45) Date of Patent: Jul. 24, 2012

(54) METHODS OF FABRICATING SILICON OXIDE LAYERS USING INORGANIC SILICON PRECURSORS AND METHODS OF FABRICATING SEMICONDUCTOR DEVICES INCLUDING THE SAME

(75) Inventors: In-Sun Yi, Suwon-si (KR); Ki-Hyun Hwang, Seongnam-si (KR); Jin-Tae Noh, Suwon-si (KR); Jae-Young Ahn, Seongnam-si (KR); Si-Young Choi, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/730,406

(22) Filed: Mar. 24, 2010

(65) Prior Publication Data
US 2010/0248465 A1    Sep. 30, 2010

(30) Foreign Application Priority Data
Mar. 24, 2009 (KR) .................. 10-2009-0024976

(51) Int. Cl.
*H01L 21/31* (2006.01)
*H01L 21/469* (2006.01)

(52) U.S. Cl. ........... 438/778; 257/E21.21; 257/E21.269; 257/E21.586; 438/591; 438/594; 438/787; 438/791

(58) Field of Classification Search ............ 257/E21.21, 257/E21.269, E21.586; 438/591, 594, 778, 438/787, 791
See application file for complete search history.

(56) References Cited

U.S. PATENT DOCUMENTS

| 6,638,879 | B2 | 10/2003 | Hsieh et al. | |
|---|---|---|---|---|
| 6,664,156 | B1 | 12/2003 | Ang et al. | |
| 7,442,656 | B2 * | 10/2008 | Matsuura | 438/788 |
| 2006/0286776 | A1 * | 12/2006 | Ranish et al. | 438/478 |
| 2009/0242957 | A1 * | 10/2009 | Ma et al. | 257/316 |

FOREIGN PATENT DOCUMENTS
KR    1020020030569 A    4/2002

* cited by examiner

*Primary Examiner* — Asok Sarkar
(74) *Attorney, Agent, or Firm* — Myers Bigel Sibley & Sajovec, PA

(57) ABSTRACT

Methods of fabricating a silicon oxide layer using an inorganic silicon precursor and methods of fabricating a semiconductor device using the same are provided. The methods of fabricating a semiconductor device include forming a tunnel insulating layer and a charge storage layer on a substrate; forming a dielectric layer structure on the charge storage layer using an atomic layer deposition (ALD) method, the dielectric layer structure including a first dielectric layer formed of silicon oxide, a second dielectric layer on the first dielectric layer formed of a material different from the material forming the first dielectric layer, and a third dielectric layer formed of the silicon oxide on the second dielectric layer; and forming a control gate on the dielectric layer structure. The first and third dielectric layers formed of the silicon oxide are formed using a first gas including an inorganic silicon precursor, a second gas including hydrogen gas or a hydrogen component, and a third gas including an oxide gas.

9 Claims, 9 Drawing Sheets

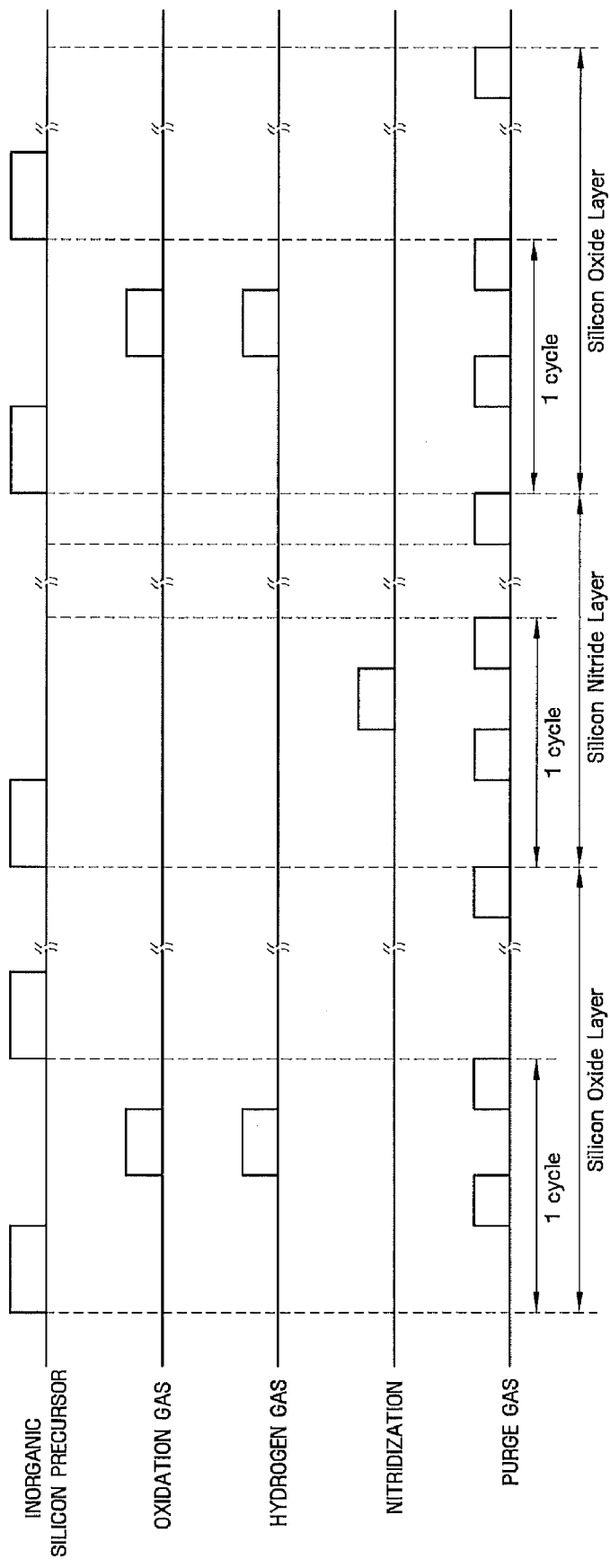

METHODS OF FABRICATING SILICON OXIDE LAYERS USING INORGANIC SILICON PRECURSORS AND METHODS OF FABRICATING SEMICONDUCTOR DEVICES INCLUDING THE SAME

CROSS-REFERENCE TO RELATED APPLICATIONS

This application claims the benefit of and priority to Korean Patent Application No. 10-2009-0024976, filed on Mar. 24, 2009 in the Korean Intellectual Property Office, the disclosure of which is incorporated by reference in its entirety.

FIELD OF THE INVENTION

The present invention relates to methods of fabricating a silicon oxide layer and methods of fabricating a semiconductor device including the same, and more particularly to methods of fabricating a silicon oxide layer using inorganic silicon precursors and methods of fabricating semiconductor devices including the same.

BACKGROUND

As semiconductor devices have become highly integrated, it has become more difficult to fabricate such semiconductor devices. In particular, it becomes very difficult to form a thin film that is used in fabricating a semiconductor device, e.g. a silicon oxide layer or the like, on a substrate with adequate step coverage.

For example, in the case of forming an inter-gate dielectric layer (or a tunnel insulating layer) interposed between a charge storage layer and a control gate in a flash memory device including a plurality of memory cells (or gate stacks), a void may occur in a space between neighboring memory cells.

On the contrary, in the case of forming a silicon oxide layer through an atomic layer deposition (ALD) method using an inorganic silicon precursor such as bis(teriary-butylamine) silane (BTBAS) or the like, the step coverage may be improved, however, the layer quality of the formed silicon oxide layer may deteriorate due to carbon (C) or nitrogen (N) components included in the inorganic silicon precursor.

SUMMARY

Accordingly, embodiments of the present invention have been made to address above-mentioned problems occurring in the prior art, and in particular, embodiments of the invention provide methods of fabricating a semiconductor device that has an improved layer quality in addition to an improved step coverage.

Additional advantages, aspects, and features of the invention will be set forth at least in part in the description which follows and will become apparent to those having ordinary skill in the art upon examination of the following or may be learned from practice of embodiments of the invention.

According to an aspect of the present invention, there is provided a method of fabricating a semiconductor device. According to one embodiment of the invention, the method includes forming, and in some instances, sequentially forming, a tunnel insulating layer and a charge storage layer on a substrate; forming a dielectric layer structure on the charge storage layer using an ALD method, the dielectric layer structure including a first dielectric layer formed of silicon oxide, a second dielectric layer formed of a material, which is different from the material forming the first dielectric layer, on the first dielectric layer, and a third dielectric layer formed of the silicon oxide on the second dielectric layer; and forming a control gate on the dielectric layer structure; wherein the first and third dielectric layers formed of the silicon oxide are formed using a first gas including an inorganic silicon precursor, a second gas including a hydrogen gas or a hydrogen component, and a third gas including an oxide gas.

According to another aspect of the present invention, there is provided a method of fabricating a semiconductor device, which includes forming a structure on a substrate; and forming a silicon oxide layer on the structure in an ALD method using a first gas including an inorganic silicon precursor, a second gas including a hydrogen gas or a hydrogen component, and a third gas including an oxide gas.

BRIEF DESCRIPTION OF THE DRAWINGS

The above and other objects, features and advantages of the present invention will be more apparent from the following detailed description taken in conjunction with the accompanying drawings, in which:

FIG. 9 is a view explaining an experimental example using a semiconductor device according to an embodiment of the present invention.

DETAILED DESCRIPTION OF THE EMBODIMENTS

Figure 1:
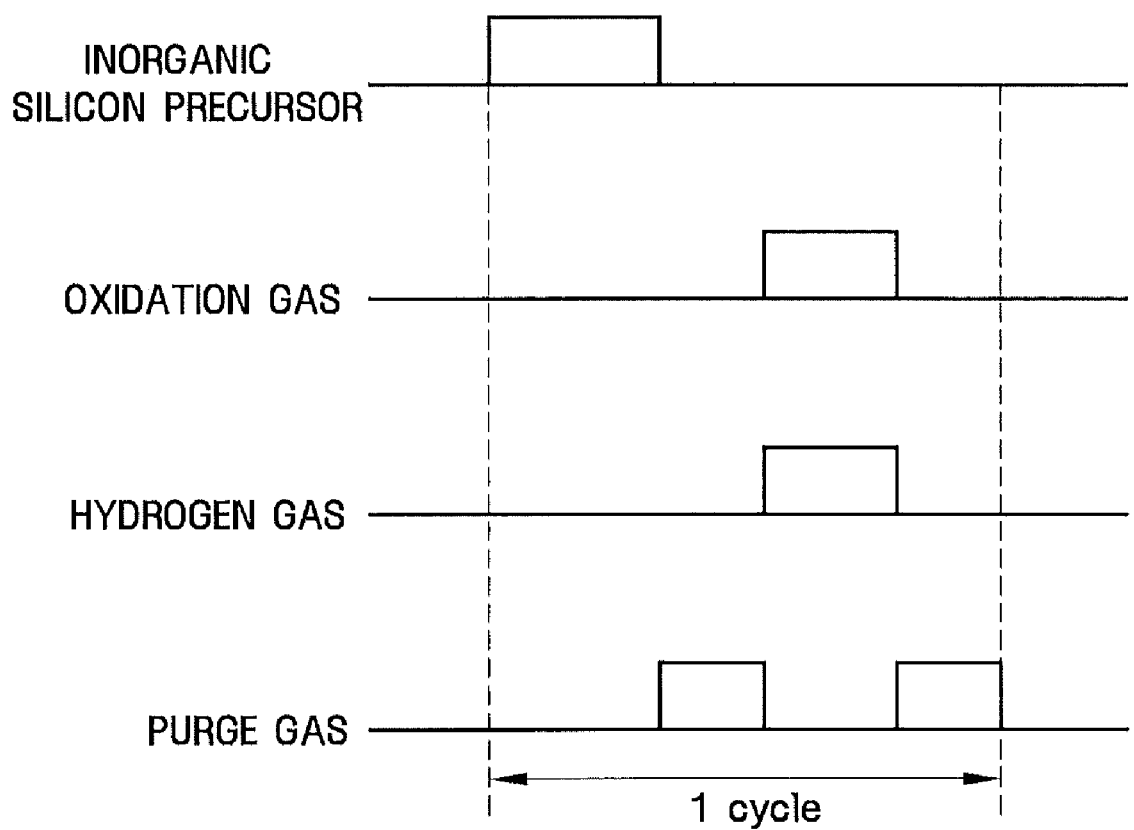
FIG. 1 is a timing diagram explaining a method of fabricating a silicon oxide layer according to an embodiment of the present invention.

Hereinafter, embodiments of the present invention will be described in detail with reference to the accompanying drawings. The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims. In the drawings, sizes and relative sizes of layers and areas may be exaggerated for clarity in explanation.

The term "on" that is used to designate that an element is on another element located on a different layer or a layer includes both a case where an element is located directly on another element or a layer and a case where an element is located on another element via another layer or still another element. In contrast, the term "directly on" means that an element is directly on another element or a layer without intervention of any other element or layer. In the entire description of the present invention, the same drawing reference numerals are used for the same elements across various figures. Also, the term "and/or" includes the respective described items and combinations thereof.

Spatially relative wordings "below", "beneath", "lower", "above", "upper", and so forth, as illustrated in the drawings, may be used to facilitate the description of relationships between an element or constituent elements and another element or other constituent element. The spatially relative wordings should be understood as wordings that include different directions of the element in use or operation in addition to the direction illustrated in the drawings. In the entire description of the present invention, the same drawing reference numerals are used for the same elements across various figures.

In the following description of the present invention, embodiments of the present invention will be described with reference to plane views and sectional views which are ideal schematic views. The form of exemplary views may be modified due to the manufacturing techniques and/or allowable errors. Accordingly, the embodiments of the present invention are not limited to their specified form as illustrated, but include changes in form being produced according to manufacturing processes. Accordingly, areas exemplified in the drawings have rough properties, and the shapes of areas in the drawings are to exemplify specified forms of areas of elements, but do not limit the scope of the present invention.

Hereinafter, with reference to FIG. 1, a method of fabricating a silicon oxide layer according to an embodiment of the present invention will be described. FIG. 1 is a timing diagram explaining a method of fabricating a silicon oxide layer according to an embodiment of the present invention.

First, an object (specifically, a structure to be formed on a substrate) on which a silicon oxide layer is to be formed is positioned in a reaction chamber. Then, after the temperature and pressure in the chamber are properly adjusted, a first gas including an inorganic silicon precursor is supplied into the chamber. Accordingly, the inorganic silicon precursor is adsorbed onto the object.

Here, the inorganic silicon precursor may be a compound that does not include C or N components, unlike organic silicon precursors that include C or N components. As such inorganic silicon precursors, for example, DiChloroSilane: $SiH_2Cl_2$ (DCS), TisChloroSilane: $SiHCl_3$ (TCS), HexaChloroDisilane: $Si_2Cl_6$ (HCD), or the like, may be used, and particularly, DCS may be used. In particular, DCS has a large number of silicon (Si) elements and chloride (Cl) elements in comparison to other inorganic silicon precursors, and thus has a relatively notable reactive capacity.

Then, a purge gas, for example, nitrogen ($N_2$), helium (He), argon (Ar) gas or other appropriate inert gas, is supplied into the chamber to remove the inorganic silicon precursor remaining (or non-reacting) in the chamber. Accordingly, the inorganic silicon precursor adsorbed onto the object may be formed with a thin thickness that reaches the thickness level of an atomic layer.

Then, a second gas including a hydrogen gas or a hydrogen component and a third gas including an oxide gas are simultaneously supplied into the chamber. The third gas including the oxide gas serves to oxidize the inorganic silicon source precursor adsorbed onto the object, and oxygen ($O_2$), ozone ($O_3$), water ($H_2O$), nitrous oxide ($N_2O$), or the like, may be used as the third gas.

In contrast, the second gas including the hydrogen gas or the hydrogen component is provided together with the oxide gas, and serves to expedite the chemical reaction between the inorganic silicon precursor and the oxide gas. Hereinafter, for convenience in explanation, it is exemplified that the second gas is, but is not limited to, the hydrogen gas ($H_2$).

Specifically, in the case of forming a silicon oxide layer using an inorganic silicon precursor such as HCD and an oxide gas such as $N_2O$, generally there is no material that can activate HCD by reacting with the Cl component of HCD, and thus reaction between HCD and $N_2O$ may not readily occur. However, in an embodiment of the present invention, since $H_2$ provided together with $N_2O$ may react with the Cl component of HCD to activate HCD, the reaction between HCD and $N_2O$ occurs more readily to form the silicon oxide. Also, even in the case of forming a silicon oxide layer using the oxide gas, such as $H_2O$, which can activate HCD by reacting with the Cl component of HCD, $H_2$ provided together with $H_2O$ can activate HCD by reacting with the Cl component of HCD, and thus the silicon oxide layer can be formed more effectively.

In contrast, the amount of the hydrogen gas, which is provided together with the oxide gas, may be less than the amount of the oxide gas. For example, a small amount of hydrogen gas may be provided only to the extent that the hydrogen gas can support the reaction between the oxide gas and the inorganic silicon precursor. However, the amount of the hydrogen gas is not limited thereto, and the amount of the hydrogen gas, which is provided together with the oxide gas, may be substantially the same as the amount of the oxide gas.

Then, a purge gas, for example, $N_2$, He, Ar gas or a suitable inert gas, is supplied into the chamber to remove the oxide gas and the hydrogen gas remaining in the chamber. As a result, a silicon oxide layer forming process of one cycle is completed, and thus a silicon oxide layer is formed on the object with a thickness that reaches the thickness level of an atomic layer.

Then, by repeating the above-described process, a silicon oxide layer may be formed on the object with a desired thickness.

In order to improve the layer quality of the silicon oxide layer, thermal treatment of the silicon oxide layer formed on the object with a particular thickness is performed. Here, the thermal treatment is performed at the same deposition temperature as that of other CVD oxide layers, e.g. at 850° C. to 1050° C., to improve the layer quality.

The silicon oxide layer formed as described above has an improved layer quality in comparison to the silicon oxide layer formed by the chemical vapor deposition (CVD) method or the like. For this, experimental examples will be described later with reference to FIGS. 3 to 4B. Also, the silicon oxide layer formed according to an embodiment of the present invention has good step coverage, and thus, it can be conformally formed on a structure having a large aspect ratio without the occurrence of a void.

In an embodiment of the present invention, since the silicon oxide layer is formed using the inorganic silicon precursor, the silicon oxide layer, unlike the situation where an organic silicon precursor is used, may not include impurities such as C, N, or the like. That is, since a charge trap site caused by C, N, or the like, does not occur, the layer quality of the silicon oxide layer may be improved. In addition, since the inorganic silicon precursor may be decomposed at high temperatures in comparison to an organic silicon precursor, the ALD process can be performed at a relatively high temperature in comparison to the instance where the organic silicon precursor is used. Accordingly, the silicon oxide layer formed in the embodiment of the present invention has an improved layer quality in comparison to the alternative where the organic silicon precursor is used.

Figure 2:
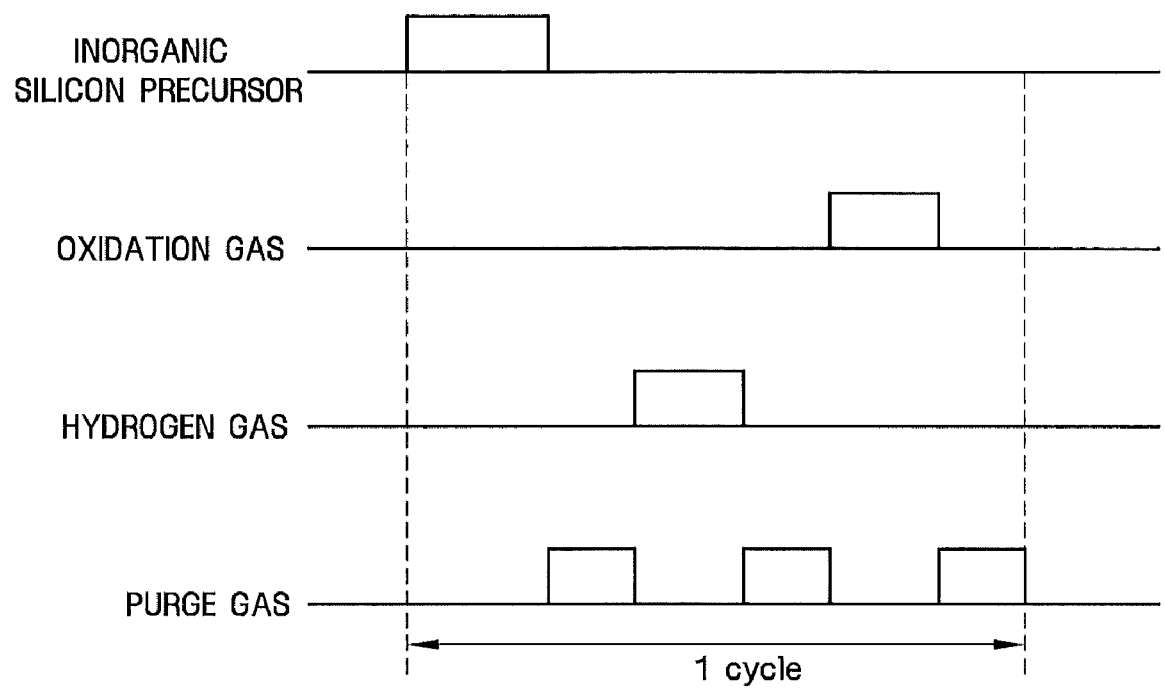
FIG. 2 is a timing diagram explaining a method of fabricating a silicon oxide layer according to another embodiment of the present invention.

FIG. 2 is a timing diagram explaining a method of fabricating a silicon oxide layer according to another embodiment of the present invention.

Referring to FIGS. 1 and 2, the second gas including the hydrogen gas or the hydrogen component and the third gas including the oxide gas may not be simultaneously provided in a method of fabricating a silicon oxide layer according to another embodiment of the present invention.

Specifically, after the first gas including the inorganic silicon precursor is supplied into the chamber in which an object, on which the silicon oxide layer is to be formed, is arranged, the first gas and the purge gas may be sequentially supplied into the chamber to remove the inorganic silicon precursor remaining in the chamber. Here, the inorganic silicon precursor may be, as described above, DCS, TCS, HCD, or the like, and in some embodiments, DCS is used as the inorganic silicon precursor.

Subsequently, the second gas including the hydrogen gas or the hydrogen component is supplied into the chamber. Accordingly, the inorganic silicon precursor, e.g. the Cl component of HCD, reacts with the second gas including the hydrogen gas or the hydrogen component to activate HCD.

Then, a purge gas, e.g. $N_2$, He, Ar gas or other suitable inert gas, is supplied into the chamber to remove the second gas including the hydrogen gas or the hydrogen component that remains in the chamber.

Then, the third gas including the oxide gas is supplied into the chamber to oxidize the inorganic silicon source precursor adsorbed onto the object and activated. Here, the third gas including the oxide gas may be, for example, $O_2$, $O_3$, $H_2O$, $N_2O$, or the like.

A purge gas, for example, $N_2$, He, or Ar gas, is supplied into the chamber to remove the third gas including the oxide gas remaining in the chamber.

Thereafter, by repeating the above-described process, a silicon oxide layer may be formed on the object with a suitable thickness.

In order to improve the layer quality of the silicon oxide layer, thermal treatment of the silicon oxide layer formed on the object with a suitable thickness is performed. Here, the thermal treatment is performed at the same deposition temperature as that of other CVD oxide layers, e.g., at 850° C. to 1050° C., to improve the layer quality.

The more detailed contents of the embodiments of the present invention will be described through the following experimental examples. Since the contents not described here can be readily envisaged and understood by one of skill in the art, the description thereof will be omitted.

Experimental Example 1

Measurement of Etching Tolerance and Surface Roughness

Experiments were performed with respect to experimental examples and comparison examples as follows.

In the experimental example, a silicon oxide layer was formed using an ALD method using HCD and $N_2O$ as an inorganic silicon precursor and an oxide gas, respectively. In contrast, in the comparison example, an MTO (Medium Temperature deposition of Oxide) layer was formed using a CVD method.

Figure 3:
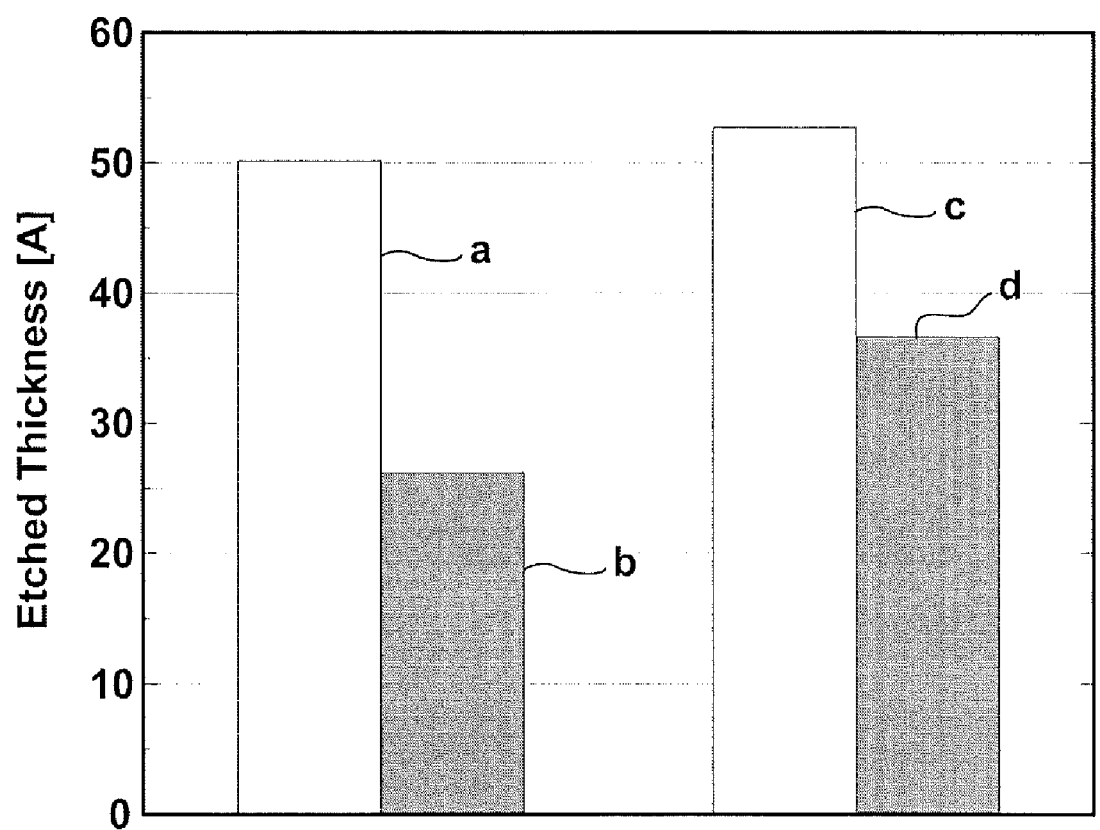
FIGS. 3 to 4B are views explaining experimental examples using silicon oxide layers according to the embodiments of the present invention.

After forming the silicon oxide layer according to the experimental example and the comparison example, the silicon oxide layer was etched for 30 seconds using HF, and the results are shown in FIG. 2. In FIG. 3, graphs "a" and "c" show the etching degrees of silicon oxide layers formed according to the experimental example and the comparison example, respectively, and graphs "b" and "d" show the etching degrees of the silicon oxide layers after the thermal treatment thereof has been performed at 830° C. for 30 minutes according to the experimental example and the comparison example, respectively.

Referring to graphs "a" and "c", it can be seen that the silicon oxide layer formed according to the experimental example has superior etching tolerance in comparison to the silicon oxide layer formed according to the comparison example. Also, referring to graphs "b" and "d", it can be seen that the thermally treated silicon oxide layer shows superior etching tolerance in comparison to the silicon oxide layer of which the thermal treatment has not been performed.

Figure 4A:
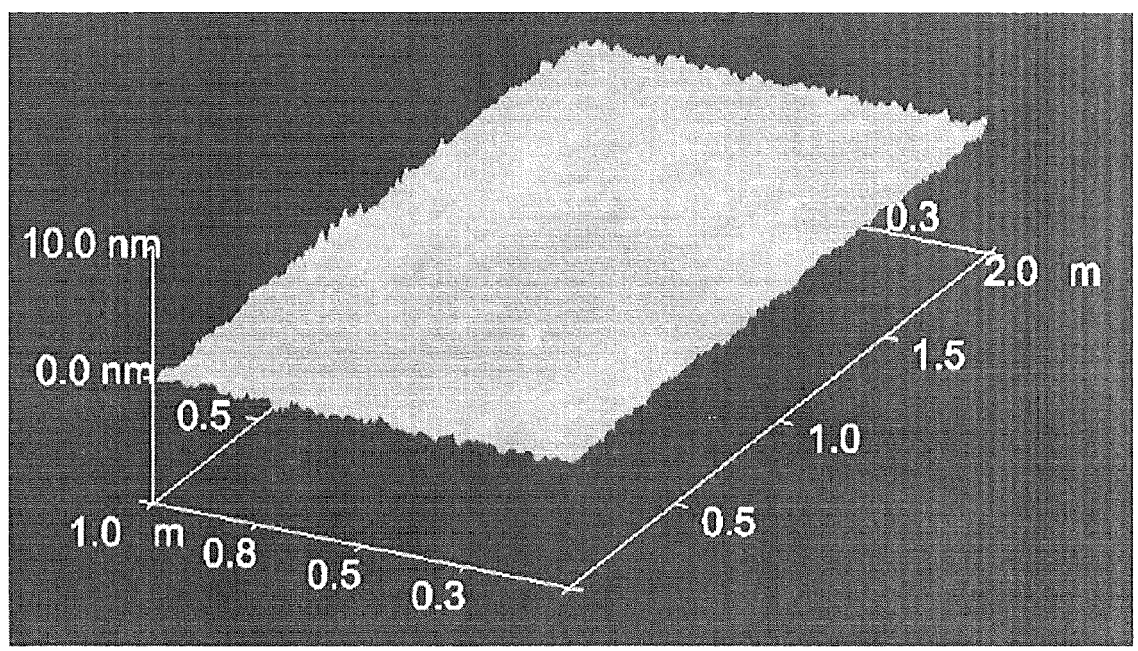
Figure 4B:
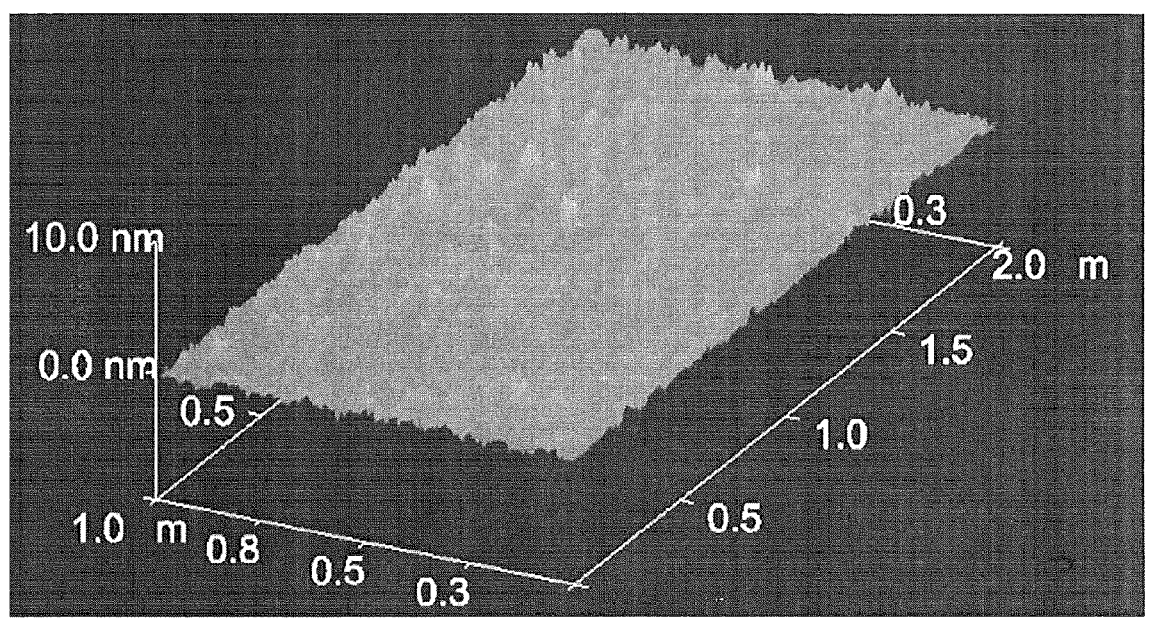

In order to measure the surface roughness of the silicon oxide layers formed according to the experimental example and the comparison example, the surfaces of the silicon oxide layer were photographed and the results are shown in FIGS. 4A and 4B. FIG. 4A shows a photograph of the surface of the silicon oxide layer formed according to the experimental example, and FIG. 4B shows a photograph of the surface of the silicon oxide layer formed according to the comparison example. Referring to FIGS. 4A and 4B, it can be seen that the silicon oxide layer formed according to the experimental example has an improved surface roughness in comparison to the silicon oxide layer formed according to the comparison example. That is, it can be seen that the silicon oxide layer formed using the ALD method using the inorganic silicon precursor has superior etching tolerance and surface roughness in comparison to the silicon oxide layer formed by CVD.

Hereinafter, a method of fabricating a semiconductor device using methods of fabricating the silicon oxide layer according to embodiments of the present invention will be described. Hereinafter, for convenience in explanation, it is exemplified that a flash memory device is fabricated as the semiconductor device. However, the semiconductor device fabricated according to embodiments of the present invention is not limited thereto.

Figure 5:
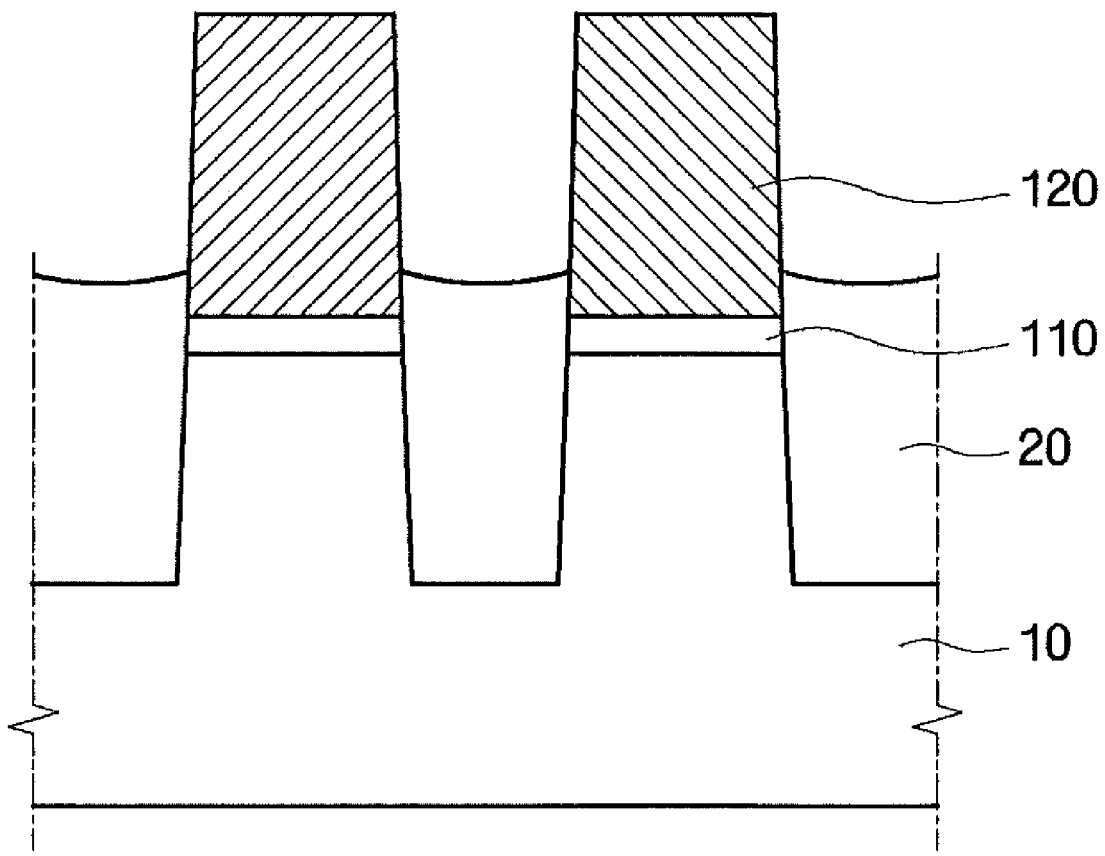
FIGS. 5 to 7 are sectional views of intermediate-stage structures explaining a method of fabricating a semiconductor device according to an embodiment of the present invention.
Figure 6:
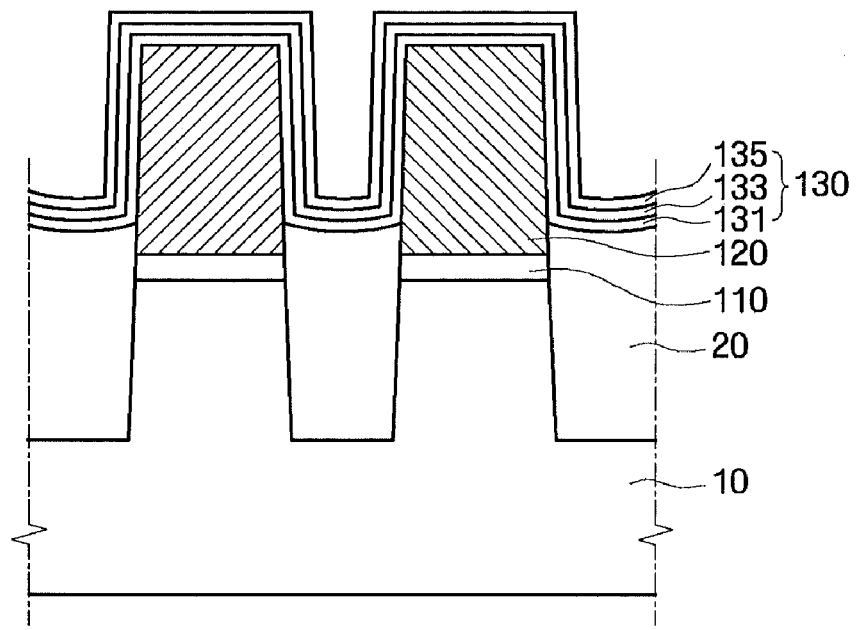
Figure 7:
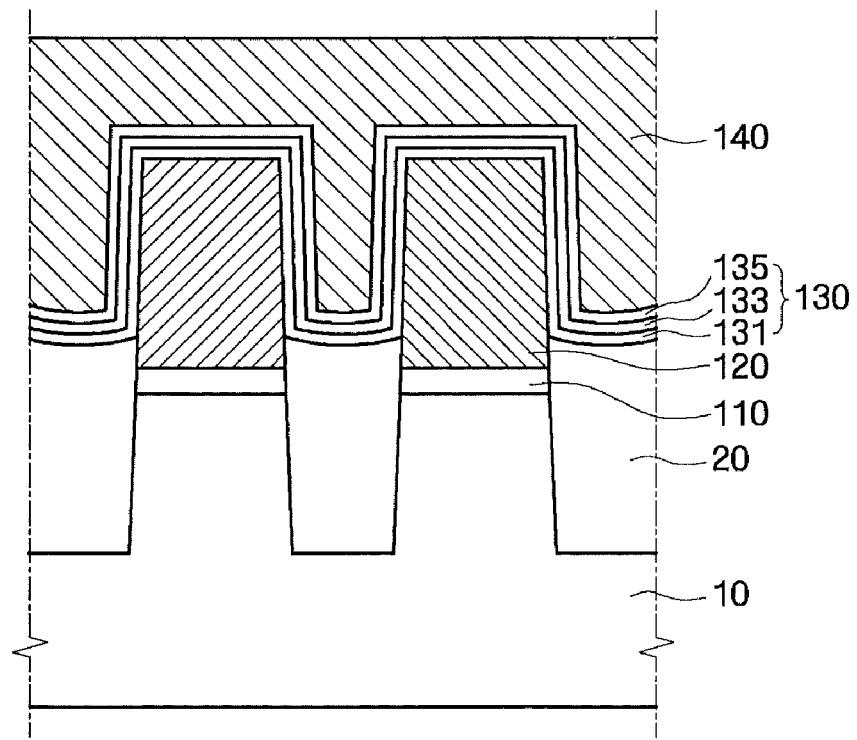
Figure 8:
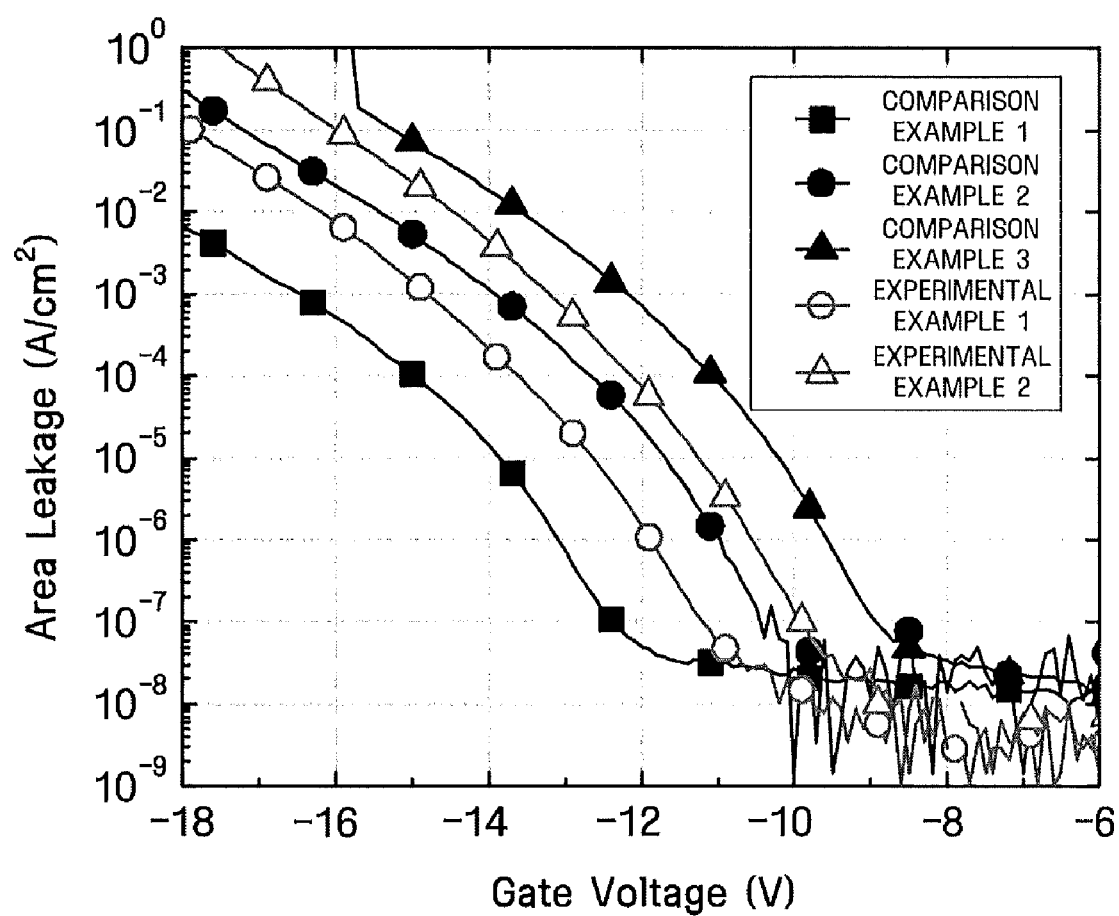
FIG. 8 is a timing diagram explaining in detail a method of forming a dielectric structure of FIG. 6.

FIGS. 5 to 7 are sectional views of intermediate-stage structures explaining a method of fabricating a semiconductor device according to an embodiment of the present invention. FIG. 8 is a timing diagram explaining in detail a method of forming a dielectric structure of FIG. 6.

First, referring to FIG. 5, a tunnel insulating layer 110 and a charge storage layer 120 are sequentially formed on the substrate 10. The tunnel insulating layer 110 provides an energy bandgap against the charge tunneling, and may include, for example, silicon oxide, silicon nitride, or a high-k material. Here, the high-k material may include, but is not limited to, a metal oxide, such as hafnium oxide, aluminum oxide, hafnium aluminum oxide, zirconium oxide, or the like. For example, the tunnel insulating layer 110 may be made of diverse materials in consideration of not only the dielectric constant but also the energy bandgap property.

The charge storage layer 120 serves to store the electric charge. The charge storage layer, if the flash memory device is of a floating gate type, may be formed of a conductive material such as a polysilicon layer, while if the flash memory device is of a charge trap type, the charge storage layer 120 may be formed of silicon nitride, hafnium oxide, zirconium oxide, tantalum oxide, hafnium nitride oxide, hafnium silicon oxide, tungsten doped aluminum oxide, nanodots, or the like.

In this instance, forming the tunnel insulating layer 110 and the charge storage layer 120 may include, but is not limited to, sequential forming of a pre-tunnel insulating layer, a pre-charge storage layer, and a mask layer on the substrate 10; forming an element isolation layer 20 by patterning the pre-tunnel insulating layer, the pre-change storage layer, and the mask layer; and removing of the mask layer. It will become apparent to those of skill in the art to which the present invention pertains that the tunnel insulating layer 110 and the charge storage layer 120 can be formed by other diverse methods.

Referring to FIGS. 6 and 8, on the charge storage layer 120, a dielectric layer structure 130, which includes a first dielectric layer 131 formed of silicon oxide, a second dielectric layer 133 formed of a material that is different from the silicon oxide, and a third dielectric layer 135 formed of the silicon oxide, is formed using an ALD method. Here, in the case where the flash memory device is a floating gate type, the dielectric layer structure 130 may be an inter-gate dielectric layer, while in the case where the flash memory device is a charge trap type, the dielectric layer structure 130 may be a blocking dielectric layer.

Hereinafter, it is exemplified that the second dielectric layer 133 is composed of silicon nitride, and the dielectric layer structure 130 is formed in-situ.

First, the semiconductor substrate 10 on which the charge storage layer 120 is formed is positioned in a chamber as an object. Then, after the temperature and pressure in the chamber are properly adjusted, a first gas including an inorganic silicon source precursor is supplied into the chamber. Accordingly, the inorganic silicon precursor is adsorbed onto the object. In various embodiments, the inorganic silicon source precursor may be DCS, TCS, HCD, or the like, and in particular embodiments, DCS may be used.

A purge gas, for example, $N_2$, He, Ar gas or a suitable inert gas, is supplied into the chamber to remove the inorganic silicon source precursor remaining in the chamber. Accordingly, the inorganic silicon precursor adsorbed onto the charge storage layer 120 is formed with a thin thickness that reaches the thickness level of an atomic layer.

A second gas including a hydrogen gas or a hydrogen component and a third gas including an oxide gas are simultaneously supplied into the chamber. The oxide gas, as described above, serves to oxidize the inorganic silicon source precursor adsorbed onto the charge storage layer 120, and may include $O_2$, $O_3$, $H_2O$, $N_2O$, or the like. In contrast, the second gas including the hydrogen gas or the hydrogen component is provided together with the oxide gas, and serves to facilitate and/or expedite the chemical reaction between the inorganic silicon precursor and the oxide gas. The amount of the hydrogen gas, which is provided together with the oxide gas, may be less than the amount of the oxide gas. However, the amount of the hydrogen gas is not limited thereto, and the amount of the hydrogen gas, which is provided together with the oxide gas, may be substantially the same as the amount of the oxide gas.

A purge gas, for example, $N_2$, He, Ar gas or a suitable inert gas, is supplied into the chamber to remove the oxide gas and the hydrogen gas remaining in the chamber. As a result, a silicon oxide layer forming process of one cycle is completed, and thus, a silicon, oxide layer is formed on the object with a thickness that reaches the thickness level of an atomic layer.

By repeating the above-described process, the first dielectric layer composed of a silicon oxide layer with a suitable thickness is formed on the charge storage layer 120.

The inorganic silicon precursor is supplied into the chamber, and thus, the inorganic silicon precursor is adsorbed onto the first dielectric layer 131.

Then, a purge gas, for example, $N_2$, He, Ar gas or a suitable inert gas, is supplied into the chamber to remove the precursor remaining in the chamber, and then a nitride gas is supplied into the chamber to form a silicon nitride layer. The nitride gas may be $N_2$, $NH_3$, NO, or the like. A purge gas is supplied into the chamber to remove the nitride gas remaining in the chamber. As a result, a silicon nitride layer forming process of one cycle is completed, and thus, a silicon nitride layer is formed on the first dielectric layer 131 with a thickness that reaches the thickness level of an atomic layer.

By repeating the above-described process, the second dielectric layer 133 composed of the silicon nitride layer with a suitable thickness is formed on the first dielectric layer 131.

The third dielectric layer 135 composed of the silicon oxide layer is formed on the second dielectric layer 133 to complete the dielectric layer structure 130. The third dielectric layer 135 may be formed using substantially the same method as the method of forming the first dielectric layer 131.

Then, the thermal treatment of the dielectric layer structure 130 is performed at 850° C. to 1050° C.

Since the dielectric layer structure as formed above has good step coverage, and thus can be conformally formed in a space between the charge storage layers 120 having a large aspect ratio without the occurrence of voids. Also, since the first to third dielectric layers 131, 133, and 135 are formed in-situ, the process can be simplified with a reduced processing time.

Further, since the silicon oxide layer and the silicon nitride layer are formed using the inorganic silicon precursor, the silicon oxide layer may not include impurities such as C, N, or the like, and the silicon nitride layer may not include impurities such as C, unlike the case where organic silicon precursor is used. That is, since a charge trap or the like caused by C, N, or the like, does not occur, the layer quality of the silicon oxide layer and the silicon nitride layer is improved, and thus, the reliability of the semiconductor device can be improved.

Also, since the inorganic silicon precursor may be decomposed at higher temperatures in comparison to the organic silicon precursor, the ALD process can be performed at relatively higher temperatures in comparison to the case where the organic silicon precursor is used. Accordingly, the dielectric layer structure 130 including the silicon oxide layer and the silicon nitride layer formed according to an embodiment of the present invention has an improved layer quality in comparison to the case where the organic silicon precursor is used.

As described above, it is exemplified that the second dielectric layer 133 of the dielectric layer structure 130 is formed of silicon nitride. However, the present invention is not limited thereto, and in another embodiment of the present invention, the second dielectric layer 133 may be formed of another dielectric material such as an aluminum oxide layer.

Also, it is exemplified that the silicon oxide layer of the first and third dielectric layers 131 and 135 is formed in accordance with the timing diagram of FIG. 1. However, the present invention is not limited thereto, and in another embodiment of the present invention, the silicon oxide layer of the first and third dielectric layers 131 and 135 may be formed in accordance with the timing diagram of FIG. 2.

Referring to FIG. 7, a control gate 140 is formed on the dielectric layer structure 130. The control gate 140, for example, may be formed of polysilicon or a metal electrode, e.g. one selected among the group including tantalum (TaN), tungsten (WN), and tungsten (W), or a combination thereof.

The detailed contents of embodiments of the present invention will be described with respect to the following experimental examples.

Experimental Example 2

Measurement of Leakage Current in Semiconductor Device

Experiments were performed with respect to first and second experimental examples and first to third comparison examples as follows. In the respective experimental examples and comparison examples, the tunnel dielectric layer, the charge storage layer, and the control gate in the flash memory structure of FIG. 7 were formed in the same manner as the silicon oxide layer and the polysilicon, respectively, and only the dielectric layer structure formed of the silicon oxide layer/silicon nitride layer/silicon oxide layer was formed in a different manner.

In the first and second experimental examples, the dielectric layer structure was formed in-situ using an ALD method. Specifically, the silicon oxide layer, as described above, was formed by repeating a cycle including the following: supply of inorganic silicon precursor (HCD)→purge (Ar)→supply of oxide gas ($N_2O$) and hydrogen gas→purge (Ar) process. In contrast, the silicon nitride layer was formed by repeating a cycle including the following: supply of inorganic silicon precursor (HCD)→purge (Ar)→supply of nitride gas ($NH_3$)→purge (Ar) process. The EOTs (Equivalent Oxide Thicknesses) of the dielectric layer structure formed as described above according to the first and second experimental examples were 122 Å and 111 Å, respectively.

In the first to third comparison examples, the dielectric layer structure was formed in-situ using a CVD method. Specifically, the silicon oxide layer was formed using silane and $N_2O$, and the silicon nitride layer was formed using silicon source and $NH_3$. The EOTs of the dielectric layer structure formed as described above according to the first to third comparison examples were 138 Å, 125 Å, and 113 Å, respectively.

Then, while changing the voltage applied to the control gate, the leakage current was measured in the first and second experimental examples and the first to third comparison examples, and the results of measurement are shown in FIG. 9.

Referring to FIG. 9, in the case of the experimental examples in comparison to the comparison examples, it can be seen that the leakage current is relatively small. Specifically, in the experimental example 1 and the comparison example 2, the EOTs are 122 Å and 125 Å, which are similar to each other, but it can be seen that the leakage current in the experimental example 1 is reduced in comparison to the comparison example 2. Similarly, in the experimental example 2 and the comparison example 3, the EOTs are 111 Å and 113 Å, which are similar to each other, but it can be seen that the leakage current in the experimental example 2 is reduced in comparison to the comparison example 3. That is, the dielectric layer structure formed according to an embodiment of the present invention has improved leakage current characteristics, and thus, the reliability of the semiconductor device formed using the dielectric layer structure can be improved.

Additionally, in the embodiments of the present invention, it is exemplified that the inter-gate dielectric layer (or tunneling dielectric layer) is formed in the flash memory device using the method of forming the silicon oxide. However, the present invention is not limited thereto, and for example, the method of forming the silicon oxide according to the embodiments of the present invention may be used to form a gate spacer formed on the gate structure (or gate stacks) or to form the element isolation layer by conformally forming the silicon oxide layer within a trench having a large aspect ratio in a highly-integrated semiconductor device. That is, the methods of forming the silicon oxide layer according to the embodiments of the present invention may be used to conformally form the silicon oxide layer on a structure having a plurality of projections or a recessed structure without the occurrence of voids.

Although particular embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of fabricating a semiconductor device, comprising:
    forming a tunnel insulating layer and a charge storage layer on a substrate;
    forming a dielectric layer structure on the charge storage layer using an atomic layer deposition (ALD) method, the dielectric layer structure comprising a first dielectric layer formed of silicon oxide, a second dielectric layer on the first dielectric layer formed of a material different from a material forming the first dielectric layer, and a third dielectric layer formed of the silicon oxide on the second dielectric layer; and
    forming a control gate on the dielectric layer structure,
    wherein the first and third dielectric layers formed of the silicon oxide are formed by providing a first gas comprising an inorganic silicon precursor selected from the group consisting of dichlorosilane (DCS), tischlorosilane (TCS) and hexachlorodislane (HCD), removing a first non-reacting gas by providing a first purge gas, providing simultaneously (a) a second gas comprising a hydrogen gas, and (b) a third gas comprising an oxide gas, and removing a second non-reacting gas and a third non-reacting gas by providing a second purge gas.

2. The method of claim 1, wherein an amount of the second gas is less than an amount of the third gas.

3. The method of claim 1, wherein forming the first and third dielectric layer comprises:
    removing a first non-reacting gas by providing a first purge gas;
    providing the second gas;
    removing a second non-reacting gas by providing a second purge gas;
    providing the third gas; and
    removing a third non-reacting gas by providing a third purge gas.

4. The method of claim 1, wherein the inorganic silicon precursor is hexachlorodislane (HCD).

5. The method of claim 1, wherein the second dielectric layer is formed of silicon nitride, and the dielectric layer structure is formed in-situ.

6. The method of claim 1, further comprising performing thermal treatment of the dielectric layer structure before forming the control gate.

7. A method of fabricating a semiconductor device, comprising:
    forming a structure on a substrate; and
    forming a silicon oxide layer on the structure employing an atomic layer deposition (ALD) method using a first gas comprising an inorganic silicon precursor, a second gas comprising a hydrogen gas, and a third gas comprising an oxide gas, wherein the second gas and the third gas are supplied simultaneously.

8. The method of claim 7, wherein the inorganic silicon precursor is hexachlorodislane (HCD).

9. The method of claim 7, wherein the structure is a gate stack formed on the substrate, and the method further comprises forming a gate spacer using the silicon oxide layer.

* * * * *